(12) United States Patent
Bex et al.

(10) Patent No.: US 9,354,528 B2
(45) Date of Patent: May 31, 2016

(54) SUBSTRATE HOLDER, LITHOGRAPHIC APPARATUS, DEVICE MANUFACTURING METHOD, AND METHOD OF MANUFACTURING A SUBSTRATE HOLDER

(75) Inventors: Jan Bex, Overpelt (BE); Nicolaas Ten Kate, Almkerk (NL); Raymond Wilhelmus Louis Lafarre, Helmond (NL); Johannes Wilhelmus Damen, Budel (NL); Eugene Maria Brinkhof, Weert (NL); Yogesh Pramod Karade, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 642 days.

(21) Appl. No.: 13/455,870

(22) Filed: Apr. 25, 2012

(65) Prior Publication Data

US 2012/0274920 A1 Nov. 1, 2012

Related U.S. Application Data

(60) Provisional application No. 61/479,554, filed on Apr. 27, 2011, provisional application No. 61/555,359, filed on Nov. 3, 2011, provisional application No. 61/593,651, filed on Feb. 1, 2012.

(51) Int. Cl.
*G03B 27/58* (2006.01)
*G03B 27/32* (2006.01)
*G03F 7/20* (2006.01)

(52) U.S. Cl.
CPC .......... *G03F 7/70708* (2013.01); *G03F 7/7085* (2013.01); *G03F 7/70716* (2013.01); *G03F 7/70875* (2013.01)

(58) Field of Classification Search
CPC ............ G03F 7/70708; G03F 7/70716; G03F 7/7085; G03F 7/70875
USPC .......................................... 355/72, 77; 427/58
See application file for complete search history.

(56) References Cited

U.S. PATENT DOCUMENTS

| | | | |
|---|---|---|---|
| 4,480,284 A | 10/1984 | Tojo et al. | |
| 4,502,094 A * | 2/1985 | Lewin ................. | H01L 21/6831 118/500 |

(Continued)

FOREIGN PATENT DOCUMENTS

| | | |
|---|---|---|
| EP | 1 359 469 | 11/2003 |
| JP | 08-330405 | 12/1996 |

(Continued)

OTHER PUBLICATIONS

Japanese Office Action mailed Jun. 24, 2013 in corresponding Japanese Patent Application No. 2012-092239.

(Continued)

*Primary Examiner* — Deoram Persaud
(74) *Attorney, Agent, or Firm* — Pillsbury Winthrop Shaw Pittman LLP

(57) ABSTRACT

A method of manufacturing a substrate holder for use in a lithographic apparatus, the method including providing a main body having a surface and a plurality of burls projecting from the surface and having end surfaces to support a substrate, providing a carrier surface adjacent the main body surface, and forming a conductive layer on at least part of the main body surface and an integral part on at least part of the carrier surface.

20 Claims, 9 Drawing Sheets

(56) References Cited

U.S. PATENT DOCUMENTS

| | | | |
|---|---|---|---|
| 4,645,218 A * | 2/1987 | Ooshio et al. | 279/128 |
| 5,221,403 A | 6/1993 | Nozawa et al. | |
| 5,663,865 A | 9/1997 | Kawada et al. | |
| 5,835,333 A | 11/1998 | Castro et al. | |
| 5,835,334 A | 11/1998 | McMillin et al. | |
| 5,885,654 A | 3/1999 | Hagiwara et al. | |
| 5,908,334 A | 6/1999 | Chen et al. | |
| 7,524,735 B1 | 4/2009 | Gauri et al. | |
| 7,940,511 B2 | 5/2011 | Sijben | |
| 2004/0114124 A1 | 6/2004 | Hoeks et al. | |
| 2004/0207824 A1 | 10/2004 | Lof et al. | |
| 2005/0030512 A1 | 2/2005 | Zaal et al. | |
| 2005/0030515 A1 | 2/2005 | Ottens et al. | |
| 2005/0045106 A1 * | 3/2005 | Boyd, Jr. | B23Q 3/154 118/728 |
| 2005/0095776 A1 | 5/2005 | Usuami | |
| 2005/0128459 A1 | 6/2005 | Zwet et al. | |
| 2005/0195382 A1 | 9/2005 | Ottens et al. | |
| 2005/0248746 A1 | 11/2005 | Zaal et al. | |
| 2006/0033898 A1 * | 2/2006 | Cadee | G03F 7/70341 355/53 |
| 2006/0038968 A1 | 2/2006 | Kemper et al. | |
| 2006/0102277 A1 * | 5/2006 | Zaal et al. | 156/290 |
| 2007/0139855 A1 | 6/2007 | Van Mierlo et al. | |
| 2008/0024743 A1 | 1/2008 | Kruit et al. | |
| 2008/0212046 A1 | 9/2008 | Riepen et al. | |
| 2008/0280536 A1 | 11/2008 | Sasaki et al. | |
| 2009/0079525 A1 | 3/2009 | Sijben | |
| 2009/0262318 A1 | 10/2009 | Van Den Dungen et al. | |
| 2009/0279060 A1 | 11/2009 | Direcks et al. | |
| 2009/0279062 A1 | 11/2009 | Direcks et al. | |
| 2010/0193501 A1 | 8/2010 | Zucker et al. | |
| 2010/0200901 A1 | 8/2010 | Kim | |
| 2011/0134399 A1 * | 6/2011 | Damen | G03F 7/70841 355/30 |
| 2011/0222032 A1 | 9/2011 | Ten Kate et al. | |
| 2011/0222033 A1 | 9/2011 | Ten Kate et al. | |
| 2012/0013865 A1 | 1/2012 | Laurent et al. | |
| 2012/0147353 A1 | 6/2012 | Lafarre et al. | |
| 2012/0152465 A1 | 6/2012 | Lindner et al. | |
| 2012/0212725 A1 * | 8/2012 | Lafarre | G03F 7/70708 355/72 |
| 2013/0094009 A1 | 4/2013 | Lafarre et al. | |
| 2013/0189802 A1 | 7/2013 | Tromp et al. | |

FOREIGN PATENT DOCUMENTS

| | | |
|---|---|---|
| JP | 2005-029401 | 2/2005 |
| JP | 2006-054289 | 2/2006 |
| JP | 2007-201068 | 8/2007 |
| JP | 2010-541196 | 12/2010 |
| KR | 2009-008658 | 1/2009 |
| WO | 99/49504 | 9/1999 |
| WO | 2008/047886 | 4/2008 |
| WO | 2010/095540 | 8/2010 |
| WO | 2011/026570 | 3/2011 |
| WO | 2013/113568 | 8/2013 |
| WO | 2013/113569 | 8/2013 |
| WO | 2013/156236 | 10/2013 |

OTHER PUBLICATIONS

U.S. Appl. No. 61/453,719, filed Mar. 17, 2011, Eugene Maria Brinkhof et al.

U.S. Appl. No. 61/444,483, filed Feb. 18, 2011, Raymond Wilhelmus Louis Lafarre et al.

U.S. Appl. No. 61/422,918, filed Dec. 14, 2010, Raymond Wilhelmus Louis Lafarre et al.

* cited by examiner

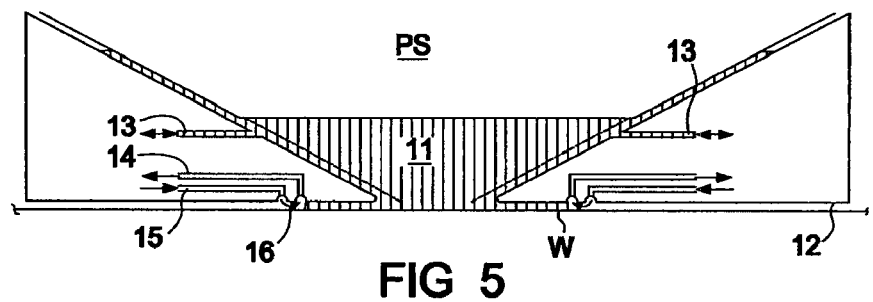
FIG 5
FIG. 6
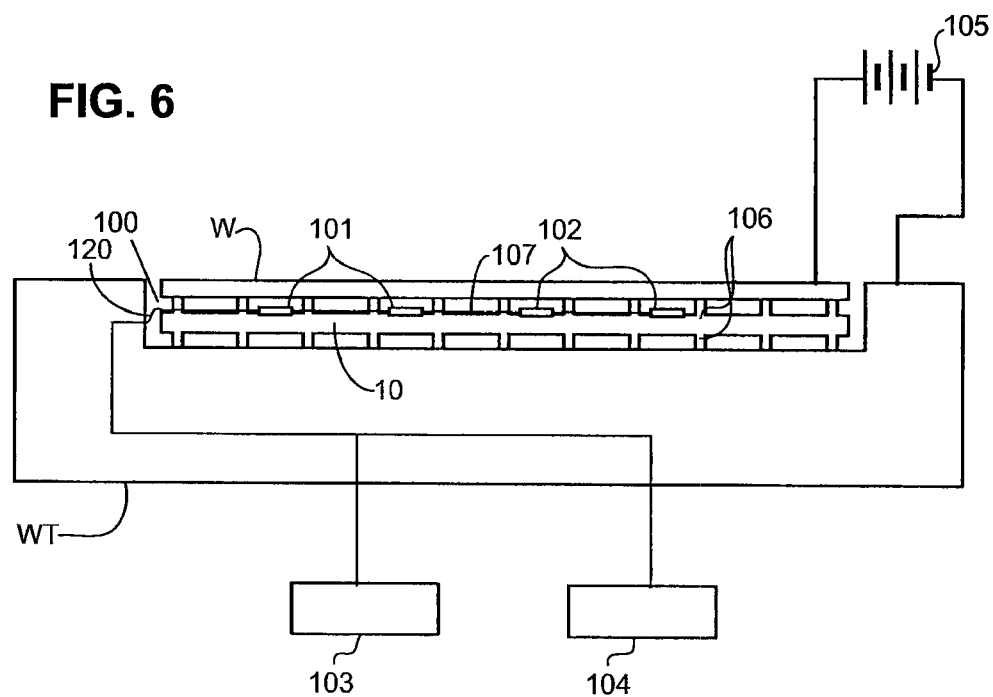
FIG. 10
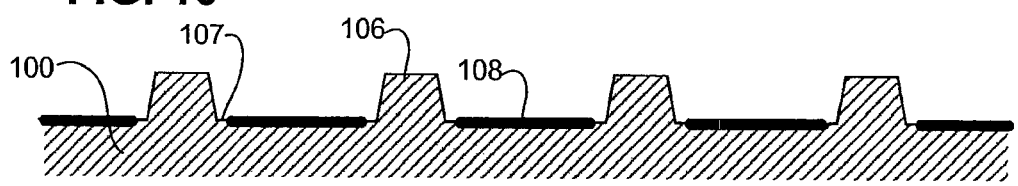

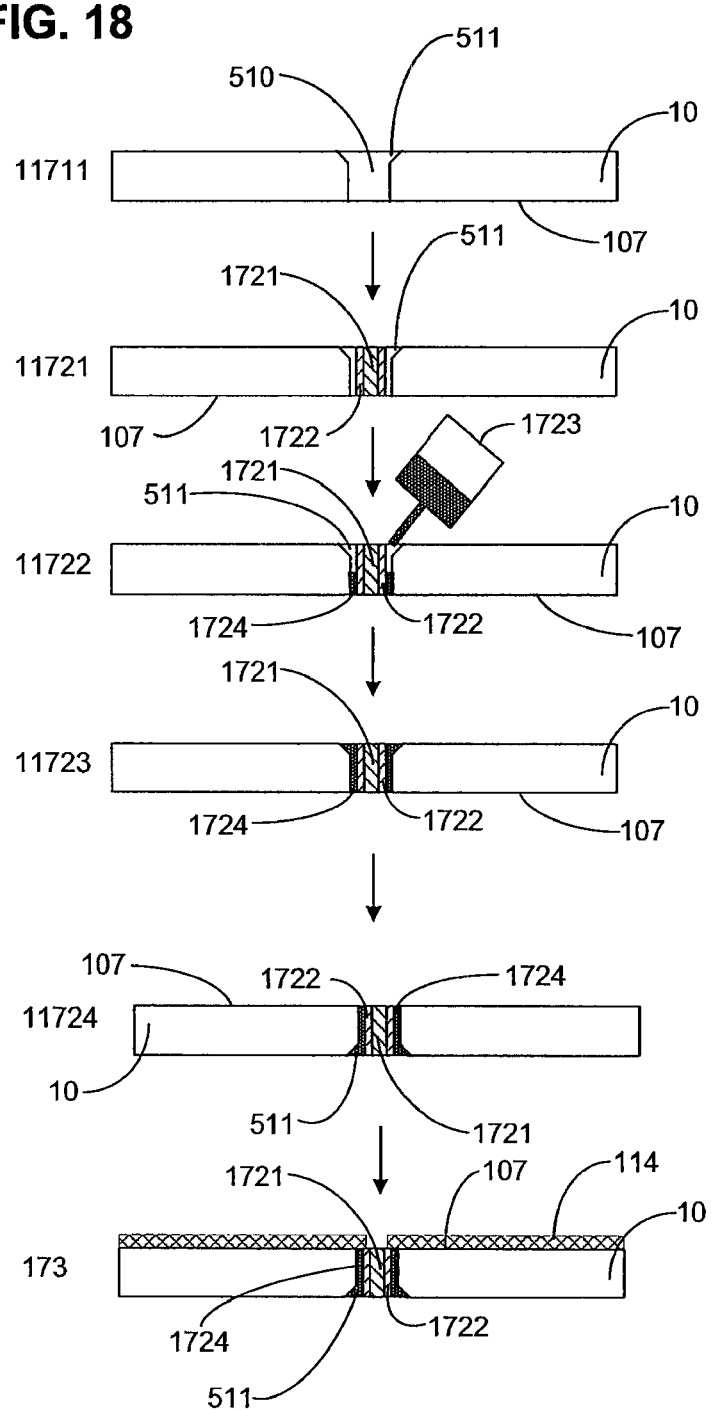

SUBSTRATE HOLDER, LITHOGRAPHIC APPARATUS, DEVICE MANUFACTURING METHOD, AND METHOD OF MANUFACTURING A SUBSTRATE HOLDER

This application claims priority and benefit under 35 U.S.C. §119(e) to U.S. Provisional Patent Application Ser. No. 61/479,554, entitled "Substrate Holder, Lithographic Apparatus, Device Manufacturing Method, and Method of Manufacturing a Substrate Holder", filed on Apr. 27, 2011, U.S. Provisional Patent Application Ser. No. 61/555,359, entitled "Substrate Holder, Lithographic Apparatus, Device Manufacturing Method, and Method of Manufacturing a Substrate Holder", filed on Nov. 3, 2011, and to U.S. Provisional Patent Application Ser. No. 61/593,651, entitled "Substrate Holder, Lithographic Apparatus, Device Manufacturing Method, and Method of Manufacturing a Substrate Holder", filed on Feb. 1, 2012. The contents of those applications are incorporated herein in their entirety by reference.

FIELD

The present invention relates to a substrate holder, a lithographic apparatus, a device manufacturing method, and a method of manufacturing a substrate holder.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus). Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

In a conventional lithography apparatus, the substrate to be exposed may be supported by a substrate holder which in turn is supported by a substrate table. The substrate holder is often a flat rigid disc corresponding in size and shape to the substrate (although it may have a different size or shape). It has an array of projections, referred to as burls or pimples, projecting from at least one side. In an embodiment, the substrate holder has an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (e.g., a contaminating particle such as a dust particle or a particle from a substrate coating) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate is separately clamped to the substrate holder.

Temperature control over the substrate surface is significant, in particular in immersion systems which are sensitive to temperature variations due to liquid (e.g. water) evaporation effects. These temperature variations lead to thermal stress in the substrate which eventually may contribute to overlay error. To achieve highly accurate temperature control, real time local measurement of the temperature combined with active heating is desired. Such a measurement and heating system is integrated into the system, i.e. in the substrate holder (wafer table) and/or substrate table (mirror block). A thin film stack can be used to make a structure that can both measure and heat, and also offer opportunities for integration into the substrate table.

It is desirable, for example, to provide a substrate table or substrate holder on which one or more electronic components, such as one or more thin-film components, with electrical connection, are formed.

According to an aspect of the invention, there is provided a method of manufacturing a substrate holder for use in a lithographic apparatus, the method comprising: providing a main body having a surface and a plurality of burls projecting from the surface and having end surfaces to support a substrate; providing a carrier surface adjacent the main body surface; and forming a conductive layer on at least part of the main body surface and an integral part on at least part of the carrier surface.

According to an aspect of the invention, there is provided a substrate holder for use in a lithographic apparatus, the substrate holder comprising: a main body having a surface; a plurality of burls projecting from the surface and having end surfaces to support a substrate; a conductive layer integral with the main body and on at least part of the main body surface with an integral part of the conductive layer extending off the main body surface.

According to an aspect of the invention, there is provided a lithographic apparatus, comprising: a support structure configured to support a patterning device; a projection system arranged to project a beam patterned by the patterning device onto a substrate; and a substrate holder arranged to hold the substrate, the substrate holder comprising: a main body having a surface, a plurality of burls projecting from the surface and having end surfaces to support a substrate, and a conductive layer integral with the main body and on at least part of the main body surface with an integral part of the conductive layer extending off the main body surface.

According to an aspect of the invention, there is provided a device manufacturing method using a lithographic apparatus, the method comprising: projecting a beam patterned by a patterning device onto a substrate while holding the substrate on a substrate holder, wherein the substrate holder comprises: a main body having a surface, a plurality of burls projecting from the surface and having end surfaces to support a substrate, and a conductive layer integral with the main body and on at least part of the main body surface with an integral part of the conductive layer extending off the main body surface.

According to an aspect, there is provided a method of manufacturing a substrate holder for use in a lithographic apparatus, the method comprising: positioning an electrical connector in a through hole extending through a main body from a surface of the main body to a side of the main body opposite the surface; and forming at least one layer on the surface including a conductive layer in electrical contact with the electrical connector. The method may comprise providing the main body having the surface and the through hole. The providing may occur before the positioning.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts, in cross-section, a barrier member which may be used in an embodiment of the present invention as an immersion liquid supply system;

FIG. 6 depicts, in cross-section, a substrate table and a substrate holder according to an embodiment of the invention;

FIG. 10 is an enlarged view of a part of the substrate holder of FIG. 6;

FIG. 18 illustrates, in cross-section, how an electrical connector may be fixed in a through hole of a main body.

DETAILED DESCRIPTION

Figure 1:
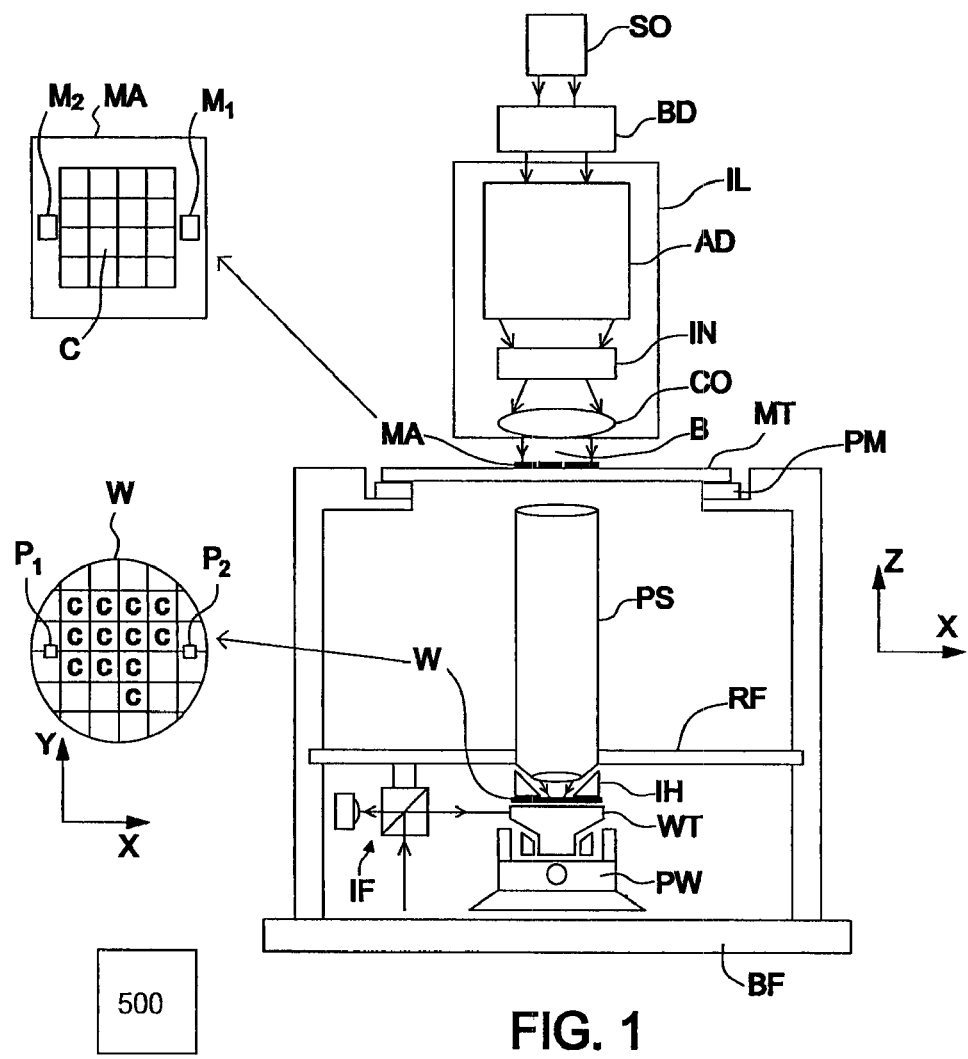
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation, DUV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stages or supports), e.g., two or more substrate tables or a combination of one or more substrate tables and one or more sensor or measurement tables. In such "multiple stage" machines the multiple tables may be used in parallel, or preparatory steps may be carried out on one or more tables while one or more other tables are being used for exposure. The lithographic apparatus may have two or more patterning device tables (or stages or supports) which may be used in parallel in a similar manner to substrate, sensor and/or measurement tables.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatus a fluid, in particular a liquid for example an immersion lithographic apparatus, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate.

Four different types of localized liquid supply systems are illustrated in FIGS. 2-5. Any of the liquid supply devices of FIGS. 2-5 may be used in an unconfined system; however, sealing features are not present, are not activated, are not as efficient as normal or are otherwise ineffective to seal liquid to only the localized area.

Figure 2:
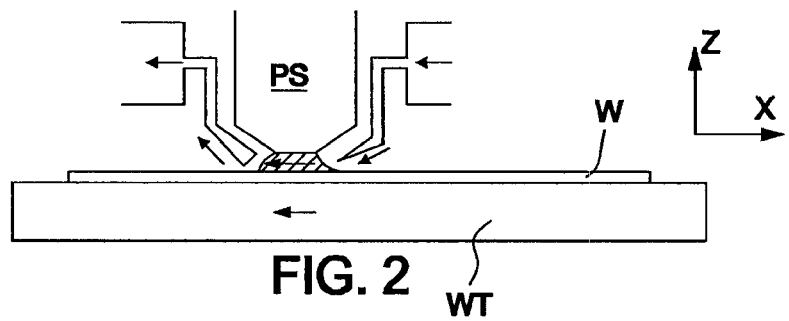
FIGS. 2 and 3 depict a liquid supply system for use in a lithographic projection apparatus.
Figure 3:
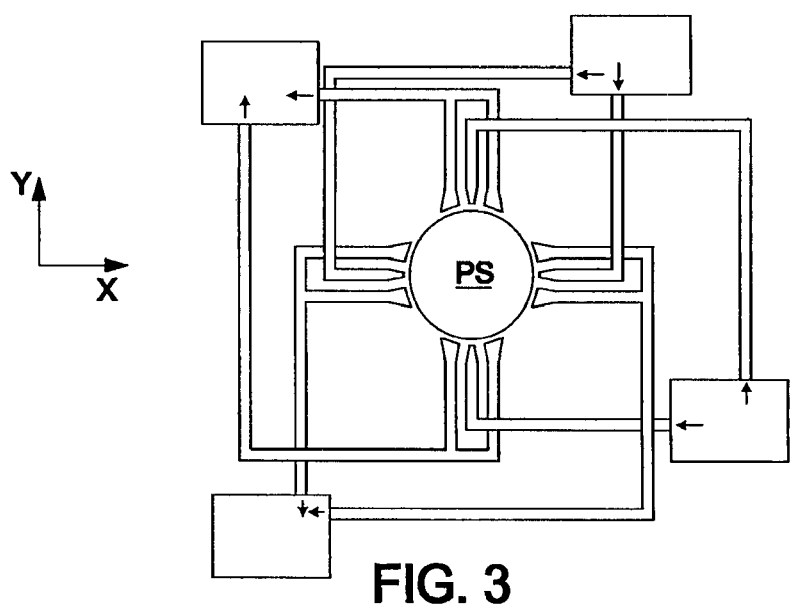

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
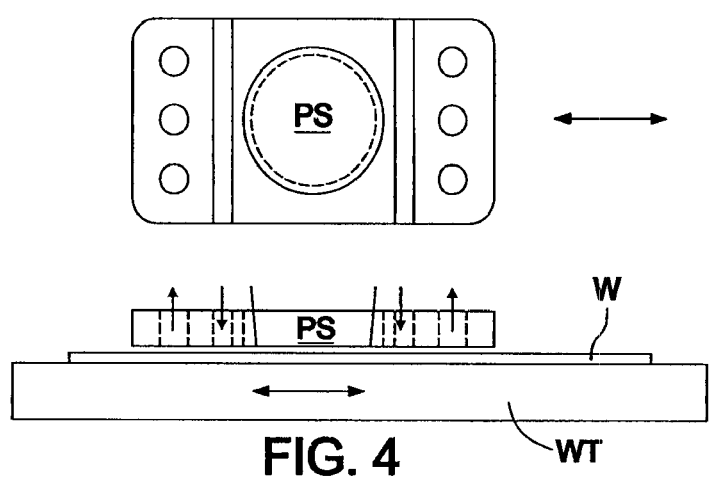
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate VV. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in United States patent application publication no. US 2004-0207824.

FIG. 5 schematically depicts a localized liquid supply system with a fluid handling structure 12. The fluid handling structure extends along at least a part of a boundary of the space between the final element of the projection system and the substrate table WT or substrate W. (Please note that reference in the following text to surface of the substrate W also refers in addition or in the alternative to a surface of the substrate table, unless expressly stated otherwise). The fluid handling structure 12 is substantially stationary relative to the projection system in the XY plane though there may be some relative movement in the Z direction (in the direction of the optical axis). In an embodiment, a seal is formed between the barrier member and the surface of the substrate W and may be a contactless seal such as a fluid seal, desirably a gas seal.

The fluid handling structure 12 at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid may be confined in the space 11 by a gas seal 16 which, during use, is formed between the bottom of the fluid handling structure 12 and the surface of the substrate W. The gas seal is formed by gas, e.g. air or synthetic air but, in an embodiment, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Another arrangement which is possible is one which works on a gas drag principle. The so-called gas drag principle has been described, for example, in United States patent application publication nos. US 2008-0212046, US 2009-0279060 and US 2009-0279062. In that system the extraction holes are arranged in a shape which desirably has a corner. The corner may be aligned with the stepping or scanning directions. This reduces the force on the meniscus between two openings in the surface of the fluid handing structure for a given speed in the step or scan direction compared to if the two outlets were aligned perpendicular to the direction of scan.

Also disclosed in US 2008-0212046 is a gas knife positioned radially outside the main liquid retrieval feature. The gas knife traps any liquid which gets past the main liquid retrieval feature. Such a gas knife may be present in a so called gas drag principle arrangement (as disclosed in US 2008-0212046), in a single or two phase extractor arrangement (such as disclosed in United States patent application publication no. US 2009-0262318) or any other arrangement.

Many other types of liquid supply system are possible. The present invention is neither limited to any particular type of liquid supply system, nor to immersion lithography. The invention may be applied equally in any lithography. In an EUV lithography apparatus, the beam path is substantially evacuated and immersion arrangements described above are not used.

A control system 500 shown in FIG. 1 controls the overall operations of the lithographic apparatus and in particular performs an optimization process described further below. Control system 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

FIG. 6 depicts a substrate holder 100 comprising a main body 10 according to an embodiment of the invention. It is held within a recess in substrate table WT and supports substrate W. The main body of the substrate holder 10 is substantially flat and substantially corresponding in shape and size to the substrate W, e.g. a disc. At least on a top side, in an embodiment on both sides, the substrate holder has projections 106, commonly referred to as burls. In an embodiment, the substrate holder 100 is an integral part of the substrate table WT and does not have burls on the lower surface. The burls are not shown to scale in FIG. 6 (or the other Figures). In a practical embodiment, there can be many hundreds or thousands of burls distributed across a substrate holder of diameter, e.g., 200 mm, 300 mm or 450 mm. The tips of the burls have a small area, e.g. less than 1 $mm^2$, so that the total area of all of the burls on one side of the substrate holder 100 is less than about 10% of the total area of the total surface area of the substrate holder. In this way, there is a very high probability that any particle that might lie on the surface of the substrate, substrate holder or substrate table will fall between burls and will not therefore result in a deformation of the substrate or substrate holder. The arrangement of burls can be regular or can vary as desired to provide appropriate distribution of force on the substrate and substrate table. The burls can have any shape in plan but are commonly circular in plan. The burls can have the same shape and dimensions throughout their height but are commonly tapered. The burls can project a distance of from about 1 μm to about 5 mm, desirably from about 15 μm to about 250 μm, from the rest of the surface of the main body 10 of the substrate holder 100. The thickness of the main body 10 of the substrate holder 100 can be in the range of about 1 mm to about 50 mm, desirably in the range of about 5 mm to 20 mm.

In an embodiment of the invention, the substrate holder 100 is made of an electrically non-conducting rigid material. Desirably the material has a high thermal conductivity or a low coefficient of thermal expansion. A suitable material includes SiC (silicon carbide), SiSiC (siliconised silicon carbide), $Si_3N_4$ (silicon nitride), quartz, and/or various other ceramic and glass-ceramics, such as Zerodur™ glass ceramic. The substrate holder 100 can be manufactured by selectively removing material from a solid disc of the relevant material so as to leave the projecting burls. A suitable technique to remove material includes electrical discharge machining (EDM), etching, machining and/or laser ablation. Some of these techniques leave a rough surface, e.g. having a roughness value Ra within an order of magnitude of several microns. The minimum roughness achievable with these removal techniques may derive from the material properties and burl manufacturing process. For example, in the case of a two-phase material such as SiSiC, the minimum roughness achievable is determined by the grain size of the two-phase material. The substrate holder 100 can also be manufactured by growing burls through a mask. The burls are of the same material as the base and can be grown by a physical vapor deposition process or sputtering.

A thin film component may be present on the surface 107 of the main body 10 between burls 106. The component may have a layer thickness in the range of from about 2 nm to about 100 μm and may be formed by a process including screen printing, chemical vapor deposition, physical vapor deposition (e.g. sputtering), dip coating, spin coating and/or spray coating. In an embodiment, a component formed on the substrate holder comprises a thin film stack, i.e. including a plurality of thin film layers. Such components are described further below.

An electronic component to be formed on the substrate table can include, for example, an electrode, a resistive heater and/or a sensor, such as a strain sensor, a magnetic sensor, a pressure sensor, a capacitive sensor or a temperature sensor. A heater and sensor can be used to locally control and/or monitor the temperature of the substrate holder and/or substrate so as to reduce undesired or induced desired temperature variation and stress in the substrate holder or substrate. It is desirable to control temperature and/or stress of the substrate in order to reduce or eliminate imaging errors such as overlay errors due to local expansion or contraction of the substrate. For example, in an immersion lithography apparatus, evaporation of residual immersion liquid (e.g., water) on the substrate may cause localized cooling and hence shrinkage of the substrate. Conversely, the energy delivered to the substrate by the projection beam during exposure can cause significant heating and therefore expansion of the substrate.

In an embodiment, the component to be formed is an electrode for an electrostatic clamp. In electrostatic clamping, a potential difference is established between the substrate, or an electrode plated on its lower surface, and an electrode provided on the substrate table and/or substrate holder. The two electrodes behave as a large capacitor and substantial clamping forces can be generated with a reasonable potential difference. An electrostatic arrangement can be such that a single pair of electrodes, one on the substrate table and one on the substrate, clamps together the complete stack of substrate table, substrate holder and substrate. In an arrangement, one or more electrodes may be provided on the substrate holder so that the substrate holder is clamped to the substrate table and the substrate separately clamped to the substrate holder.

In an embodiment, one or more localized heaters 101 are controlled by controller 103 to provide a desired amount of heat to the substrate holder 100 and substrate W to control the temperature of the substrate W. One or more temperature sensors 102 are connected to controller 104 which monitors the temperature of the substrate holder 100 and/or substrate W. Voltage source 105 generates a potential difference e.g. of an order of magnitude of 10 to 5,000 volts, between the substrate W and the substrate holder 100 and between the substrate holder 100 and the substrate table WT so that an electrostatic force clamps the substrate W, substrate holder 100 and substrate table WT together. In an embodiment, the potential difference is provided between an electrode on the lower surface of the substrate W and an electrode on the bottom of the recess in the substrate table WT. Arrangements using one or more heaters and temperature sensors to locally control the temperature of a substrate are described in U.S. patent application publication no. US 2012-0013865, which document is incorporated herein by reference in its entirety. The arrangements described therein can be modified to make use of a resistive heater and temperature sensor as described herein.

The localized heaters 101 and temperature sensors 102 each comprise at least an electrically conductive layer. The conductive layer is on at least a part of an upper surface 107 of the main body 10 of the substrate holder 100. An integral part 120 of the conductive layer extends off the main body surface 107. The integral part 120 of the conductive layer performs electrical connection between the heaters 101 and sensors 102 and their respective controllers 103, 104. The integral part 120 of the conductive layer extends between the main body 10 of the substrate holder 100 at least part way to the controllers 103, 104, thereby to provide electrical connection (for signals and/or power) to/from the heaters and sensors 101, 102 to/from the controllers 103, 104.

In the embodiment of FIG. 6 the integral part 120 of the conductive layer extends to a side wall of the recess in the substrate table WT in which the substrate holder 100 is positioned. For example, a plug at a distal end of the integral part 120 of the conductive layer is plugged into a socket in the wall of the recess and conventional cabling then continues the electrical connectivity to the controllers 103, 104.

The conductive layer is integral with the main body 10. As described below, the conductive layer is formed on the upper surface 107 of the main body 10 thereby to become integral with the main body 10. The conductive layer may be directly on the surface 107 or indirectly on the surface, for example via a planarization layer and/or an isolation layer as hereinafter described. The conductive layer (and any further layers) are formed on the main body 10 in situ as described hereafter. The conductive layer may be formed by screen-printing, sputtering, spraying, physical vapor deposition (PVD), chemical vapor deposition (CVD), plasma-enhanced chemical vapor deposition (PECVD) or any other suitable technique. The planarization layer and/or isolation layer(s) may also be formed by any of those techniques or by other techniques, such as spin coating (because those coatings may not be required to be formed in a pattern).

Figure 7:
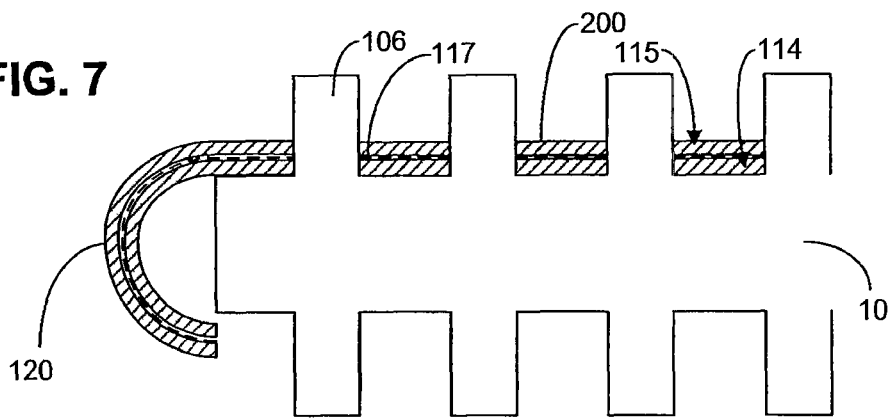
FIG. 7 depicts, in cross-section, a detail of an edge of the substrate holder of FIG. 6.

FIG. 7 illustrates, in cross-section, the substrate holder of FIG. 6. As can be seen, a thin-film stack 200 comprises a conductive layer 117 with isolating layers 114, 115 on either side. In one embodiment the conductive layer 117 and/or one or both isolating layers 114, 115 comprise more than one layer. The thin film stack 200 has a part formed on the surface 107 of the main body and an integral part 120 extending off the surface 107 of the main body. The integral part of the conductive layer 120 may be bent out of the plane of the main body surface 107. For this purpose a material that can withstand high strain, such as a polymer, is suitable. In one embodiment the Young's Modulus of the stack 200 is equal to or less than 10 GPa, desirably equal to or less than 5 GPa. In this way the electrical connection between the heater 101, the sensor 102 and controllers 103, 104 is easier to make. Assembly of the substrate holder 100 into the recess of the substrate table WT is easier than an arrangement without the integral conductive layer 120.

Figure 8:
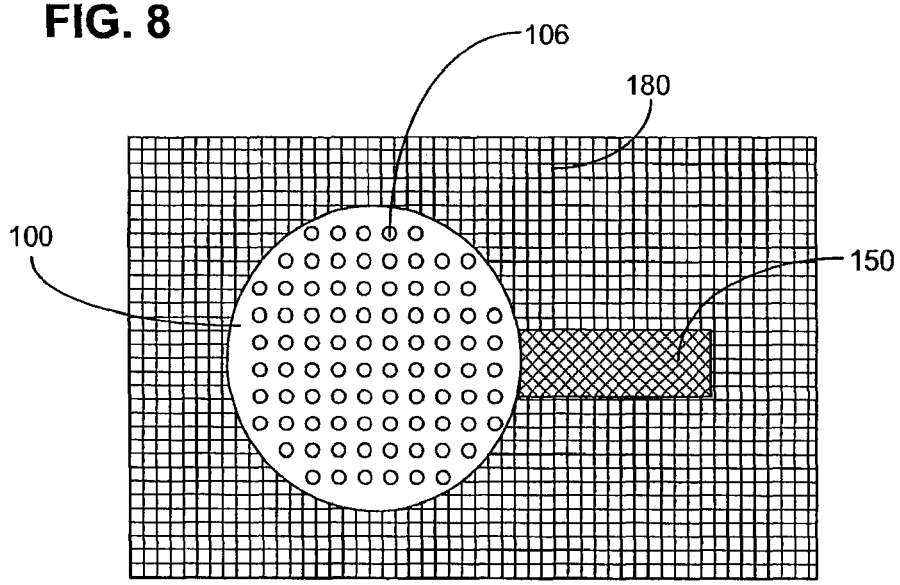
FIG. 8 illustrates, in plan, a method of manufacturing a substrate holder.
Figure 9:
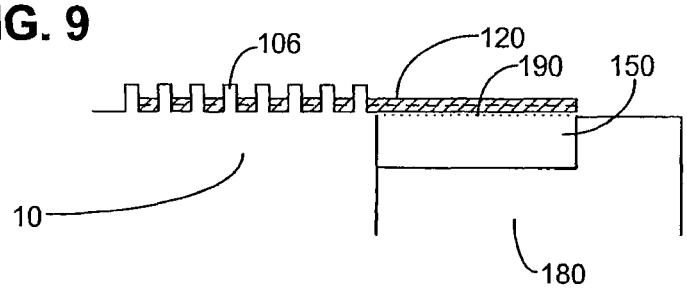
FIG. 9 depicts, in cross-section, the substrate holder and further body of FIG. 8.

FIG. 8 is a plan view of a substrate holder 100 and carrier surface 150 illustrating a method of manufacturing the stack 200 of FIG. 7. The conductive layer 117 is formed on at least part of the main body surface 107 (in one embodiment on an isolation layer on the main body) at the same time as on at least part of a carrier surface 150. The carrier surface 150 may be formed by any body including the main body or a further body 180 as illustrated. In an embodiment the carrier surface 150 is substantially co-planar to the surface 107 of the main body 10. This is illustrated in FIG. 9 which is a cross-sectional view of the embodiment of FIG. 8.

The carrier surface 150 on which the conductive layer 117 is formed comprises a release surface. Any layer formed on the release surface which forms a bottom surface of the stack 200 can be lifted off or removed from the release surface. In an embodiment the release surface comprises a coating 190. In an embodiment the coating comprises at least two layers, for example a bottom glass layer followed by a metal layer. A third layer, a non-stick layer, may then follow. The release surface is only present on the carrier surface 150. In this way the conductive layer 117 (and optionally isolation layer 114, 115) formed on the surface 107 of the main body 10 of the substrate holder 100 becomes integral with the substrate holder 100. The conductive layer 117 (and optionally isolation layer 114, 115) formed on the carrier surface 150 can be lifted off the carrier surface 150. The part of the conductive layer 117 lifted off the carrier surface 150 remains integral with the part of the conductive layer 117 on the surface 107 of the main body 10 of the substrate holder 100.

In one embodiment, the carrier surface 150 is relatively thin (say 10 to 100 μm). In one embodiment the carrier surface 150 is not detached from the conductive layer 117 (and any other layer) formed on it. The flexibility of the conductive layer 117 and carrier surface 150 is maintained in this embodiment due to the material used for the carrier surface 150 and its thickness. The carrier surface 150 may be formed in a separate process and may be of a shape, in plan, to conform to the shape of the integral part 120.

Because of the properties of the materials and thicknesses of the layers of the stack 200, the integral part 120 of the conductive layer extending off the main body surface 107 may be flexible and thereby allow for manipulation, for example to bring it to a position at which the conductive metal layer 117 may be connected to an electrical circuit.

Figure 12:
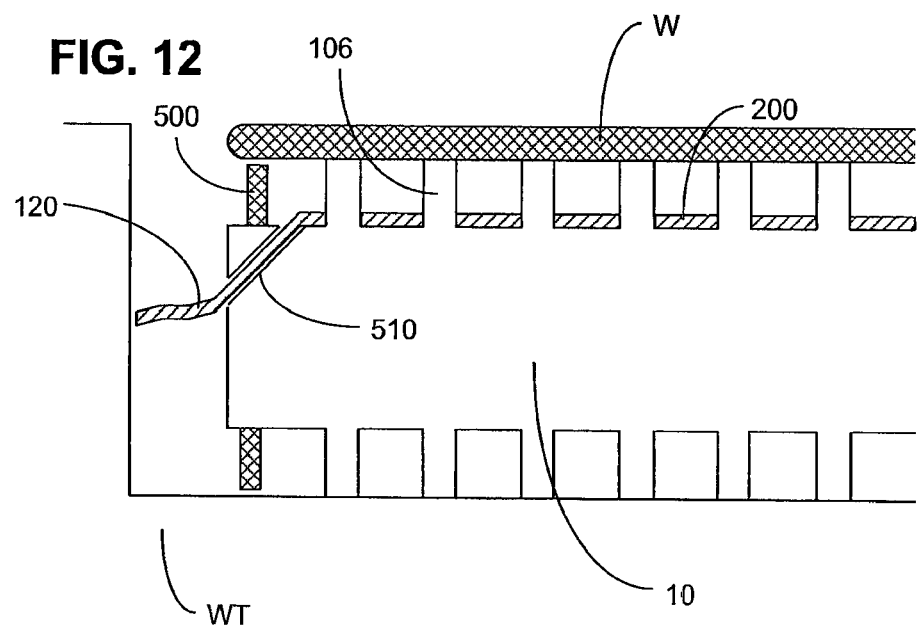
FIGS. 12-14 illustrate, in cross-section, different embodiments of a substrate holder according to an embodiment of the invention.
Figure 13:
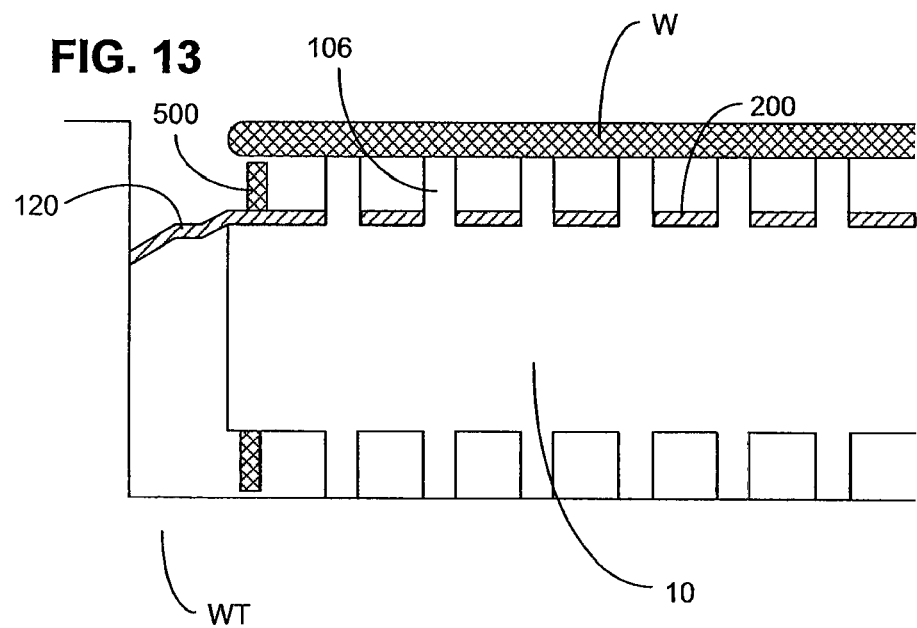
Figure 14:
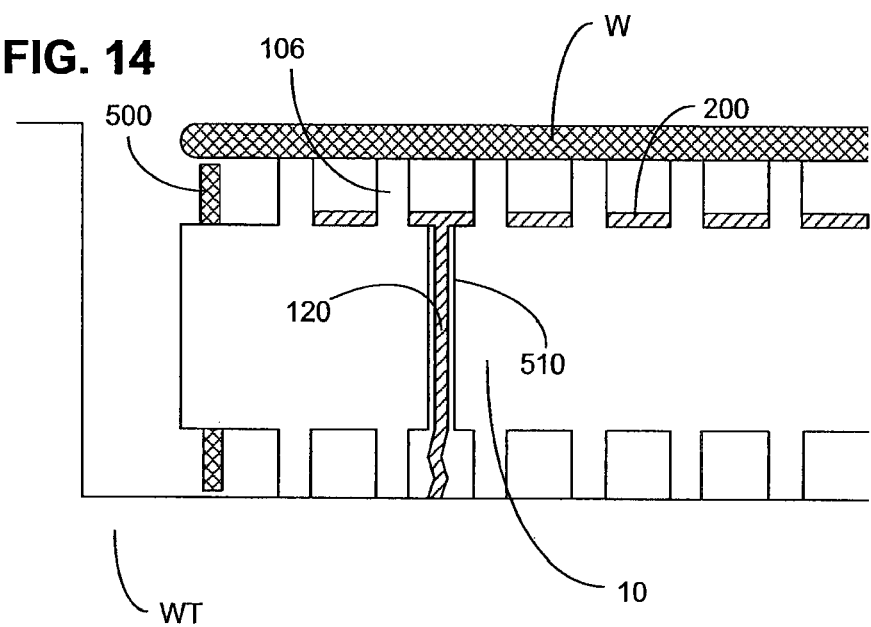

As can be seen from FIG. 8, the integral part 120 of the conductive layer extends a distance from the main body 10. Typically the distance is of the order of magnitude of a few 10 s of millimeter, for example, at least 20, 30, 40, 50 or 60 mm from the main body. In an embodiment the distance is at least equal in magnitude to the thickness of the main body 10. Desirably the length of the integral part 120 is between one and ten times the thickness of the main body. This allows bending of the integral part 120 to the underside of the main body 10 as illustrated in FIG. 7. FIGS. 12-14 illustrate other routing for the integral part 120 and the integral part requires a corresponding length.

In an embodiment, the conductive layer is patterned (for example in the case of being applied by sputtering or CVD or spraying) by use of a mask. The pattern ensures that the material (e.g. metal) of the conductive layer 117 is deposited in the correct position for forming the desired component (e.g. heater 101 or sensor 102). Additionally, the pattern includes lines of conductive material to provide electrical signals and/or power to/from the components (e.g. heaters 101, sensors 102) and a distal end of the integral part 120. These lines can be considered as wires which replace individually connected wires previously connected to the components between the burls 106. Connecting such wires has previously been problematic because of the limited space between the components on the main body 10 of the substrate holder 100 and the bottom surface of the substrate W. The gap may be of the order of magnitude of 50 to 500 μm, for example 150 μm (where a gas flow is present, in use, between the surface 107 of the substrate holder 100 and the substrate W (for example in an immersion lithographic apparatus)). The gap may be as low as 1, 10 or 30 μm where there is no flow between the surface 107 of the substrate holder 100 and the substrate W but an under pressure (for example a low pressure of hydrogen which improves thermal conductivity between the substrate W and the substrate holder 100, during imaging (a so called backfill gas)).

The integral part 120 not only solves the problem of connecting the components electrically to the edge of the substrate holder 100 but also solves the problem of then connecting those electrodes to the relevant controllers (because the substrate holder 100 is a component removable from the substrate table WT). Reliability is increased because the number of connections is reduced. There is only a single connection whereas with a prior wire arrangement two connections (at each end of the wire) were provided. The integral part 120 enables there to be one electrical connection to the conductive layer 117 on the main body. An intermediate connection which is connected to the conductive layer on the main body (and implies at least two electrical connections, at each end of the intermediate connection (i.e. a wire)) is unnecessary. In an embodiment there is only one connection between the controller 103, 104 and the thin film stack. The connection is remote from the top surface of the substrate holder 100. This results in more space being available to make the connection and a problem associated with making a connection on a top surface of the substrate holder 100 is reduced. Minimizing or reducing the number of interconnections reduces the risk of failure (i.e. improves the reliability at high voltage), particularly for an electrostatic clamp. A reduction in noise may be expected by reducing the number of interconnections. This is particularly relevant when the stack comprises component used to sense so that the desired sensitivity of the sensor can be achieved.

Simple heaters 101 and temperature sensors 102 may be comprised solely of material of the conductive layer 117. However, in some embodiments it may be necessary to provide one or more isolating layers 114, 115 which are electrically insulating. In an embodiment the integral part 120 at least has isolating layers 114, 115 on either side of the conductive layer 117. The isolating layers 114, 115 may be such as described in U.S. Patent Application No. 61/453,719 filed on 17 Mar. 2011 or U.S. Patent Application No. 61/444,483 filed on 18 Mar. 2011 each of which is hereby incorporated in its entirety by reference. Alternatively or additionally a planarization layer such as that described in U.S. 61/444,483 may be used.

Figure 11:
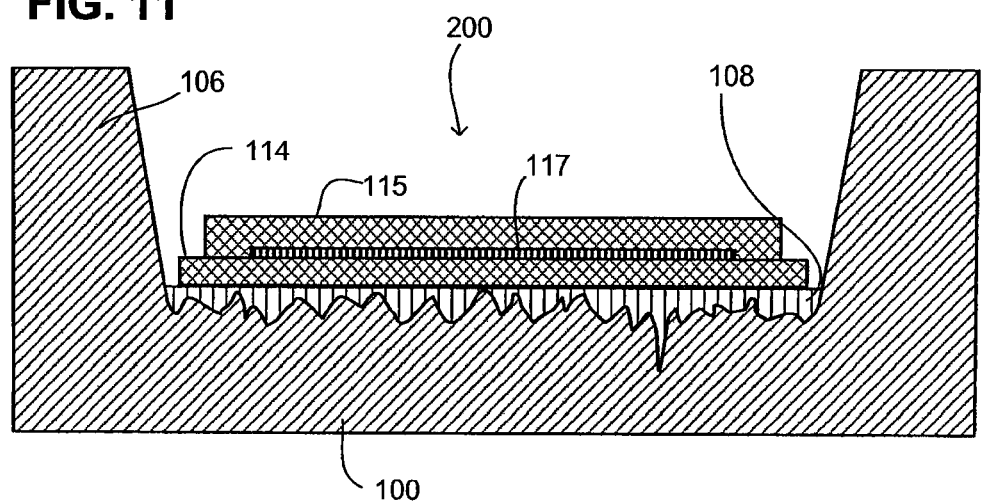
FIG. 11 depicts in cross-section a substrate holder according to an embodiment of the invention.

Any structure of stack 200 may be used. Some non limiting embodiments are described below, in particular with reference to FIGS. 10 and 11. FIG. 10 explains the use of a planarization layer 108 and FIG. 11 shows an example structure of a stack 200 comprising the electrically conductive layer 117. The planarization layer 108 may only be on the surface 107 of the main block (main body 10) of the substrate holder 100. In an embodiment the isolation layer 114 is only formed on the carrier surface. In an embodiment the top isolation layer 115 is only formed on the carrier surface.

FIG. 10 is an enlargement of part of the substrate holder 100 of FIG. 6 showing the upper surface 107 and some burls 106 in cross-section. In an embodiment of the invention, a planarization layer 108 is provided on the upper surface 107 in at least some areas between the burls 106. In an embodiment, the planarization layer 108 can be provided only where an electronic component is to be formed or across substantially the entire upper surface of the substrate holder 100. The planarization layer 108 fills in roughnesses of the upper surface 107 and provides an upper surface that is substantially smoother than the surface 107. In an embodiment of the invention the roughness Ra of the surface of the planarization layer is less than about 1.5 μm, desirably less than about 1 μm, or desirably less than about 0.5 μm. In an embodiment, a roughness Ra of less than 0.2 μm is achieved by polishing the planarization layer 108 in between the burls after curing.

In an embodiment, the planarization layer 108 is formed by applying a plurality, e.g. two, layers of coating material or precursor material. In an embodiment, the planarization layer 108 may be formed by applying a single layer of coating material or precursor material. Depending upon the material of the planarization layer it can be possible to determine from inspection of the formed coating that it has been applied by forming multiple sub-layers. In an embodiment, the multiple sub-layers of the planarization layer 108 are formed of the same material. In an embodiment, the multiple sub-layers of the planarization layer 108 are formed of different materials. Suitable materials are discussed below.

In an embodiment, the planarization layer 108 is formed of a silicon oxide or silicon nitride-based compound with a functional group attached to each Si (Silicon) atom. The functional groups can be selected from the group consisting of hydrogen, methyl, fluoro, vinyl and the like. In an embodiment, the planarization layer 108 is formed of $Si(CH_3)_2O_x$. In an embodiment the planarization layer is formed of SiOx, e.g. $SiO_2$. In an embodiment the planarization layer is formed of benzocyclobutene (BCB). In an embodiment the planarization layer is formed of a polyimide coating material. A method of applying such a material is described in U.S. Pat. No. 7,524,735, which document is incorporated herein in its entirety by reference. In an embodiment the planarization layer is formed of polymer chains consisting of $Si(CH_3)_2N$ and $Si(CH_3)_2O$ backbones. In an embodiment the planarization layer is formed of Parylene® which is a poly(p-xylylene) polymer.

The planarization layer 108 may have a thickness in the range of from about 0.2 μm to about 200 μm, desirably from about 2 μm to about 30 μm. The planarization layer is desirably sufficiently thick to fill-in most or all of the roughnesses of the surface of the substrate holder. If the planarization layer is too thick, it is more likely to crack during curing. Applying the planarization layer in a plurality of separate coats, as described below, can reduce the chance of such cracking and reduce the surface roughness of the final layer.

In an embodiment, the planarization layer 108 is applied by coating the substrate holder 100 with a polysilazane solution which is then cured to form the silicon-based planarization layer. In an embodiment, the polysilazane solution is applied by a spray technique. Additionally or alternatively, other techniques such as deposition and spin coating can be used. U.S. Patent Application No. 61/444,483 filed 18 Feb. 2011, hereby incorporated in its entirety by reference, discloses details other properties and ways of forming a planarization layer 108 in particular, as well as details of various layers of a stack 200.

The planarization layer provides a surface that is sufficiently smooth for reliable formation of a metal or other layer to form a thin film component. In particular, glass bonding steps that may be required with some materials used to form a substrate holder may be unnecessary.

The polysilazane solution may be sprayed across the upper surface 107 of the substrate holder 100 and cured to form a continuous layer. This layer initially covers the burls 106 as well as the spaces between them. In a second step, the planarization material is removed from the top of the burls 106. This removal step can be performed using a known technique, such as machining (lapping or polishing), a chemical process (such as etching) with a laser, and/or chemical mechanical polishing (CMP). This method has an advantage that it is quick, involving only two steps.

In an embodiment, a photoresist is applied to the whole of the upper surface 107 of the substrate holder 100. The photoresist is then selectively exposed and the exposed or unexposed photoresist, depending on whether the photoresist is positive or negative, is removed, so that photoresist remains only covering the burls 106. Planarization material 108 is then applied. Finally, the remaining photoresist is removed to leave planarization material 108 only in the spaces between the burls 106.

In both of the above methods, the planarization layer 108 can be applied in multiple coating steps in order to reduce the surface roughness.

As shown in FIG. 11, an embodiment of the invention involves deposition of different layers forming a thin-film stack 200 on a (SiSiC) surface of a substrate holder 100 between the burls 106 in the following general order viz. 1) planarization layer 108, 2) isolation layer 114 (if necessary), 3) metal lines 117 (the electrically conductive layer) and 4) top isolation layer 115, (or multiple stacked conductive and isolation layers, e.g. repetition of steps 3 and 4). In an embodiment of the present invention the thin layer stack can be formed on a substrate holder formed of other materials (as described above) or a substrate table formed of similar materials.

The planarization layer 108 is in general as described above but other forms of layer and methods of forming the layer can be used. The planarization layer in an embodiment has a thickness greater than 10 μm. A SiSiC substrate table has rough surface (with high Ra of approximately 4 μm and peak to valleys of approximately 43 μm) between the burls. Such roughness does not allow patterning of thin metal electrode lines (e.g., thickness of 20 to 200 nm). To reduce the roughness, polymer dissolved in a suitable solvent is sprayed on the rough SiSiC surface. The liquid layer fills up the valleys present on the EDM finished rough SiSiC between the burls. The liquid is cured to evaporate the solvent and form a smooth polymer layer or planarization layer. Metal electrode lines can be patterned on such a planarized surface. If the planarization layer is sufficiently thick and covers all the sharp SiSiC peaks, it may also provide electrical isolation between the SiSiC and the patterned metal electrode lines. The planarization layer can be sprayed all at once or built in a stack by repeating the cycle of spraying a thin layer, curing and spraying a next layer and so on until the desired layer thickness is achieved. A planarization layer may consist of sprayed layers of BCB (40% bis-benzocyclobutene dissolved in 1,3,5-trimethyl benzene) alone or in combination with sprayed layers of NN 120 (20% perhydropolysilazane in di-butyl ether).

The planarization layer is suitable for facilitating the metal electrode patterning, but may not cover all the SiSiC peaks. A thin layer (isolation layer) of PECVD (Plasma Enhanced Chemical Vapor Deposition) $SiO_x$ can be deposited on top of the planarization layer to provide electrical isolation between the SiSiC peaks and metal electrode lines if necessary. If the electrical isolation provided by isolation layer is not sufficient, a planarization layer may be sandwiched between two isolation layers and the stack follows the sequence of first isolation layer (PECVD $SiO_x$), then planarization layer and second isolation layer (PECVD SiO$_x$). The isolation layer 201 desirably has a thickness greater than 0.1 µm. Desirably it has a thickness less than 10 µm. In an embodiment the isolation layer has a thickness of 5 µm.

On top of the isolation layer, metal lines 117 (of the electrically conductive layer) are deposited by photolithography or metal deposition and etching through a hard mask. Metal lines of the conductive layer 117 desirably have a width greater than 5 µm, 10 µm or 20 µm. The maximum width of the metal lines is determined by their function and available space; it can be several 10 s of millimeters. Other methods of forming the metal lines are usable. In the case of a heater and/or sensor, wide metal lines (e.g. about 1500 µm) can be used as heating elements and narrow metal lines (e.g. about 100 µm) can be used as sensor elements. For an electrostatic clamp, two halves of continuous metal film (but isolated from the burl tops) separated by approximately 500 µm from each other can be deposited to form positive and negative elements of the electrostatic clamp. Metal lines desirably have a layer thickness greater than about 20 nm, desirably greater than about 40 nm. Metal lines desirably have a layer thickness less than or equal to about 1 µm, desirably less than about 500 nm, desirably less than about 200 nm.

For heater and/or sensor development, patterned metal lines may consist of Ti—Pt (10 nm thick titanium for better adhesion of approximately 250 nm thick platinum) lines with varying widths. Patterning of Ti/Pt can be achieved using a combination of photo resist deposition, PVD for metal film deposition and a lift off process. For a heater alone, wide chromium lines (~1500 µm) can be deposited by Cr film deposition (PVD) and selective Cr etching from the burl tops using a hard mask. For an electrostatic clamp, metal electrodes can consist of aluminum, or chromium or any other conductive material or stacks of conductive materials (e.g. Ti—Cu—Ti) and can be formed by PVD or sputtering. Alloys of these metals can also be used.

It is desirable to electrically isolate deposited metal lines from above and protect them from particle depositions, scratches and oxidation. Hence a top isolation layer 115 is deposited on the patterned electrodes. For a heater or a sensor, the isolation layer can be deposited by spray coating of BCB and/or NN 120 or SiO$_x$ as described previously or a combination of sprayed layers and SiO$_x$. In the case of an electrostatic clamp, a top isolation layer 115 also provides dielectric strength so that the clamping pressure and gap between the layer stack and substrate can be tuned to desired values. In an embodiment, the top isolation layer for an electrostatic clamp consists of spray coated polymer layers of BCB, NN 120 (or combination of these two sprayed materials) or SiO$_x$ alone or a combination of sprayed polymers layers and SiO$_x$, or parylene (CVD) alone or polyamide, desirably poly(4,4'-oxydiphenylene-pyromellitimide) which is available under the trade name Kapton® from DuPont. Typically the film 200 is flexible meaning that it is not stiff enough to support its own weight. For example, the materials have a relatively low Young's Modulus and the layers are of a relatively low thickness such that the film is deformable under self-weight.

In an embodiment isolation layers 114, 115 are used in the integral part 120 but not elsewhere. In an embodiment the isolation layers 114, 115 used in the integral part 120 comprise different materials to those of the isolating layers 114, 115 on the surface 107. In an embodiment the materials used for the isolation layers 114, 115 on the integral part are those as described in U.S. Patent Application No. 61/453,719 filed 17 Mar. 2011, which is hereby incorporated in its entirety by reference.

Typically the stack 200 can be made in a similar way to a flexible film used for electronic circuitry such as a flexible PCB or a flexible foil such as those available under the tradename HiCoFlex® available from e.g. HIGHTEC MC AG of Lenzburg, Switzerland.

In an embodiment the stack 200 has a total thickness of 150 µm or less. In one embodiment the stack 200 has a total thickness of greater than 15 µm. In one embodiment the stack 200 may be in the form of an ultra thin flexible film (foil) (thickness range 20-50 µm). For example the ultra thin flexible foil may be a HiCoFlex® film such as that available from HIGHTECH MC AG of Lenzburg, Switzerland. Such a film is used in micro electronics. The film is made in-situ on the main body 10 using spin coating of the insulating layers 114, 115 and sputtering of the electrically conductive layer 117. These processes allow good thickness uniformity to be achieved. Using HiCoFlex® film, the thickness uniformity for total thickness is +/−1.5-2 µm.

Each layer of electrically isolating material 114, 115 making up the stack 200 may be 7-8 µm thick. The stack 200 may comprise two (or more) layers of electrically insulating material (e.g. polyimide) to form the electrically isolating layer 114, 115 with a total thickness of about 15 µm. The electrically conductive layer 117 is then formed by sputtering and might be a few hundred nm thick (e.g. 200 nm thick). The electrically conductive layer 117 may consist of a plurality of layers, for example Ti—Cu—Ti or Ni—Cr. During sputtering a mask may be used thereby to impart a pattern to the deposited metal. In this way an electrode may be defined in the electrically conductive layer 117. Two or more further electrically isolating layers on top of the electrically conductive layer may be deposited to form the electrically isolating layer 115 and thereby to encapsulate the electrically conductive layer.

The polymer material or plastics material of the ultra thin flexible foil may be a polyimide. Polyimide withstands the high voltages applied to the electrode (the polyimide needs to be leak-tight (e.g. not be formed with any pinholes) and have good long term physical properties).

An advantage of using ultra thin flexible film technology is increased simplicity of the substrate holder 100, ease of manufacture of the substrate holder 100 and the possibility of forming the integrated interconnect (the integral part 120). That is, formation of a flexible film is easier than bonding glass or glass ceramic or ceramic components together or glass or glass ceramic or ceramic components to electrodes. Additionally manufacture of an ultra thin flexible film is much cheaper.

In an embodiment, the stack 200 may be made like a standard flexible PCB material such as that available from Electronic Apparatus NV, Tessenderlo, Belgium. In an embodiment, such flexible PCB material comprises polyimide, polyester, PTFE, LCP layers.

The polymer or plastics material of the electrically isolating layers in an embodiment has a Young's Modulus equal to or less than 10 GPa, desirably equal to or less than 5 GPa. Polyimide has a Young's Modulus of about 2.5 GPa and this compares to the Young's Modulus of ULE® ceramic of 67 GPa. The top isolation layer 115 desirably has a layer thickness greater than about 0.1 µm, desirably greater than about 1 µm. Top isolation layer 115 desirably has a layer thickness less than about 10 µm, desirably less than about 3 µm, for heaters and sensors. For an electrostatic clamp, top isolation layer 115 desirably has a layer thickness less than about 100 µm, desirably less than about 20 µm. In an embodiment the thickness is in a range from about 10 to about 60 µm.

In an embodiment a lower isolation layer 114 under the conductive layer 117 (and over the optional planarization layer 108) may have the same properties and may be made in the same way as the top isolation layer described above.

Table 2 shows examples of suitable materials per layer in order to build a thin film stack. Each layer may be formed of one of the listed materials or a combination of two or more materials.

TABLE 2

| Appl. Layer | 1. Heater only | 2. Sensor & Heater | 3. Clamp |
|---|---|---|---|
| Planarization | BCB spray<br>CAG 37 spray<br>NN 120 spray | BCB spray<br>CAG 37 spray<br>NN 120 spray | BCB spray<br>CAG 37 spray<br>NN 120 spray |
| Bottom isolation | BCB spray<br>CAG 37 spray<br>NN 120 spray<br>SiO$x$<br>PVD/CVD/<br>PECVD/<br>Sputtering<br>Polyimide | BCB spray<br>CAG 37 spray<br>NN 120 spray<br>SiO$x$<br>PVD/CVD/<br>PECVD/<br>Sputtering<br>Polyimide | BCB spray<br>CAG 37 spray<br>NN 120 spray<br>SiO$x$<br>PVD/CVD/<br>PECVD/<br>Sputtering<br>Parylene CVD<br>Polyimide |
| Metal layer | Chrome,<br>Ti—Cu—Ti,<br>Ni—Cr, etc.<br>PVD/CVD/<br>Sputtering | Platinum,<br>Ti—Cu—Ti,<br>Ni—Cr, etc.<br>PVD/CVD/<br>Sputtering<br>lift-off | Chrome,<br>Ti—Cu—Ti,<br>Ni—Cr,<br>Aluminum, etc.<br>PVD/CVD/<br>Sputtering |
| Top isolation | BCB spray<br>CAG 37 spray<br>NN 120 spray<br>SiO$x$<br>PVD/CVD/<br>PECVD/<br>Sputtering<br>Polyimide Spray | BCB spray<br>CAG 37 spray<br>NN 120 spray<br>SiO$x$<br>PVD/CVD/<br>PECVD/<br>Sputtering<br>Polyimide Spray | BCB spray<br>CAG 37 spray<br>NN 120 spray<br>SiO$x$<br>PVD/CVD/<br>PECVD/<br>Sputtering<br>Parylene CVD<br>Polyimide Spray |

Table 3 shows examples of specific function and requirements per layer for the applications.

TABLE 3

| Appl. Layer | 1. Heater only | 2. Sensor & Heater | 3. Clamp |
|---|---|---|---|
| Planarization | reduce roughness | reduce roughness | reduce roughness<br>improve flatness<br>(pressure uniformity) |
| Bottom isolation | moderate electrical isolation<br>low temperature difference across the layer<br>short response time | high electrical isolation (for sensor resolution)<br>low temperature difference across the layer<br>short response time | high dielectric strength<br>high volume resistivity<br>low temperature difference across the layer |
| Metal layer | heater power | sensor sensitivity<br>sensor stability<br>heater power | high voltage requirements<br>(electrode layout) |
| Top isolation | encapsulation | encapsulation | high dielectric strength<br>high volume resistivity<br>low temperature difference across the layer |

Thin film technology offers an overlay improvement and a cost effective solution for heater and/or sensor development. Metal pattern designs can be modified easily (by modifying mask designs). In an electrostatic clamp, the layer stack may avoid critical glass bonding steps used in the current substrate clamp manufacturing process. Because the clamp can be built up in between the burls it is possible to have SiSiC burls. This is beneficial for wear. If a platinum (Pt) metal layer is used, a titanium adherence layer can first be applied to improve adhesion of the Pt layer. For electrostatic clamps, any suitable metal having a low resistance can be used.

In an embodiment, the planarization layer and thin film stack are deposited on a flat base. Holes for burls are left or created by etching the planarization layer and thin film stack through a mask or photoresist. The burls are then grown in the holes.

Dielectric layers can be deposited by spray coating, spin coating and PECVD techniques. Spray coating is particularly suitable for depositing a polymer based layer (dissolved in organic solvent) such as a BCB and/or NN 120 layer. Such a polymer layer can be used to planarize SiSiC surface between the burls by filling up valleys. But, first sprayed layers may suffer from surface defects such as pin-holes (because of local impurities) and cracks (most likely because of stresses induced in the layers) if too thick layers are deposited. It is possible to reduce the effect of these surface imperfections by combining different deposition processes. In an embodiment of the invention, layers can be applied using an inkjet or bubble-jet printing technique. This allows for local control of the layer thickness, which can be useful to correct for local variation in the surface contour or the surface roughness of the substrate holder. These techniques also enable patterning of a conductive layer using a conductive ink. A combination of different materials and/or layer formation techniques can be desirable as a defect in one layer can be cured by another layer.

In an embodiment of the invention on top of the rough surface of substrate holder 100, planarization layer 108 is formed by the following layers. A first layer is formed, e.g., by a spray coating method as described above. After the spray coating process, a second layer can be deposited as a PECVD SiO$_x$ layer. The second layer covers possible pinholes and particles present in the first layer. After the PECVD SiO$_x$ layer, a third layer of BCB is sprayed to fill possible pinholes in the SiO$_x$. By having two different characteristic processes the effect of pinholes and particles is reduced or minimized. The spray coating will fill in the gaps and the CVD process covers the particles. This stacking of thin layers (spraying and PECVD) can be repeated for increased strength and robustness to pinholes and particles. In an embodiment of the invention the first layer is deposited by, for example, PECVD, and the second layer is formed by spray or spin coating. In an embodiment of the invention, three or more different layer types, e.g. different compositions or different methods of application, may be used in a desired order. A thin film stack (not shown) forming an electrical component is provided on top of planarization layer 108.

An embodiment of the invention has a planarization layer 108 formed of two spray coated layers of BCB with an intermediate curing step which improves the robustness to pinholes and particles. This stack will consist of a first spray coated layer to fill in the roughness and surface imperfections of the substrate (similar to the previous embodiment). The layer between the burls is cured to obtain the desired dielectric properties. Possible pinholes in the first layer are filled when a second BCB layer is sprayed and cured. It is possible to repeat this process to reduce the chance of pinholes. A thin film stack (not shown) forming an electrical component is provided on top of planarization layer 108. The process or stack structure may be as described in U.S. Patent Application No. 61/444,483 filed 18 Feb. 2011, which is hereby incorporated in its entirety by reference.

In an embodiment, the stack 200 may form one or more of the components. The component may form a transistor or other logic device. Such logic devices can be used to control an array of heaters disposed across the surface of the substrate holder without requiring individual connections to each heater. The transistors can be arranged at the intersection of word and bit lines and each connected to an associated heater to form an active matrix.

FIGS. 12-14 illustrate different embodiments of routing of the integral part 120 of the conductive layer. In the embodiments of FIGS. 12 and 14 the integral part 120 of the conductive layer extends through the main body 10. In the embodiment of FIG. 13 the integral part 120 of the conductive layer extends through a barrier protrusion 500 surrounding the burls 106 on the surface of the main body 10 of the substrate holder 100. The barrier protrusion 500 functions during use as a seal between the main body 10 and the substrate W. The seal substantially prevents the atmosphere either side of the barrier protrusion 500 from crossing the barrier protrusion 500. This is beneficial in an immersion system because it helps prevent liquid ingressing beyond the seal under the substrate W. In an EUV tool, it can help an atmosphere form beneath the substrate, when the top surface of the substrate is exposed to a vacuum. The embodiments of FIGS. 12 and 13 may be used with a substrate table WT which works on an under pressure without gas flow in which 5 to 25 connections are typically required to be made by the integral part 120. The embodiment of FIG. 14 may be desirable for a substrate table WT used in an immersion system where a flow of gas is present between the bottom surface of the substrate W and the upper surface 107 of the main body 10 of the substrate holder 100. In that embodiment many more connections are used and at least one through hole 510 in the main body for the passage therethrough of the integral part 120 may be required.

FIG. 12 illustrates an embodiment of main body 10 of a substrate holder 100, in cross-section. In this embodiment the integral part 120 of the conductive layer passes through a through hole 510 in the main body. The through hole 510 has an opening in the top surface 107 of the main body 10 as well as in a side surface of the main body 10. During manufacture a release layer (as a carrier surface) may be applied to part of the top surface 107 of the main body 10 so that part of the conductive layer formed on the main body can be peeled off so that the integral part 120 of the conductive layer can be passed through the through hole 510. Only one through hole 510 is illustrated in FIG. 12. However, there may be more than one through hole 510.

In the embodiment of FIG. 13, the arrangement is similar to that in FIG. 7. That is, the integral part 120 passes over the edge of the main body 10. In this embodiment the barrier protrusion 500 is locally at least partly removed to allow passage therethrough of the integral part 120. It may be necessary to vary the barrier protrusion 500 such that its height above the surface 107 of the main body is substantially constant around the periphery. The variation can be carried out by depositing an extra layer locally or by using a glue like material, for example epoxy. In an embodiment, the through hole 510 passes through the barrier protrusion 500. In an embodiment, the through hole 510 is at the top or rim of the barrier protrusion 500. At least part of the integral part 120 may thereby form a part of the barrier protrusion 500.

In the embodiment of FIG. 14, a through hole 510 passes through the main body 10 of the substrate holder 100. The though hole 510 has an opening in the top surface 107 of the main body 10 and an opening in the bottom surface of the main body 10. As with the embodiment of FIG. 12, during manufacture of the integral part 120 of the conductive layer, a release coating may be applied selectively to the top surface of the main body 10. Indeed it may not be necessary to provide a further body adjacent an edge of the main body surface for this embodiment or that of FIG. 12. In an embodiment the carrier surface may be provided by a further body which is positioned on top of the main body 10. Thus, the carrier surface may be formed at least in part on the main body surface.

Figure 15:
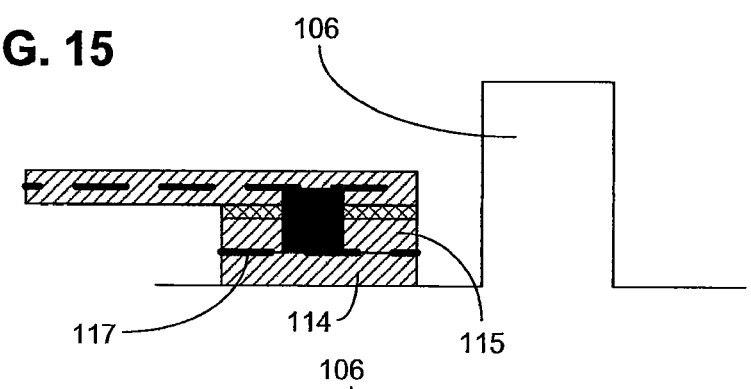
FIGS. 15 and 16 depict, in cross-section, examples of connection details of a wire to the conductive layer of a thin film stack.
Figure 16:
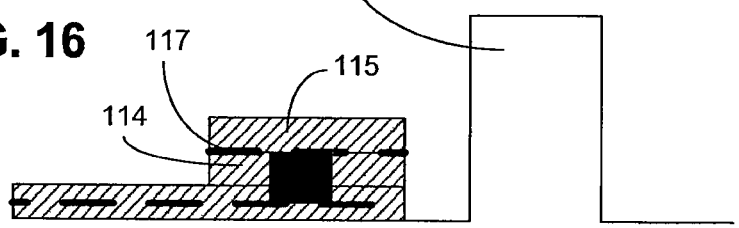

FIGS. 15 and 16 show, in cross-section, how connections may be made to components on the main body surface 107. FIG. 15 shows how a wire may be attached to the conductive layer from above (e.g. by soldering, gluing, pressure contact, etc.). FIG. 16 shows how a wire may be connected to a conductive layer from below (e.g. by deposition of a layer over an embedded wire or deposited metal layer). Both of these embodiments are applicable to all of the embodiments of FIGS. 12-14 and any of the six combinations can be used. It should be appreciated that these two embodiments are each an alternative to the integral part 120. Unlike the integral part, each of these two connections are connected to the conductive layer and do not as such form an integral part thereof.

Figure 17:
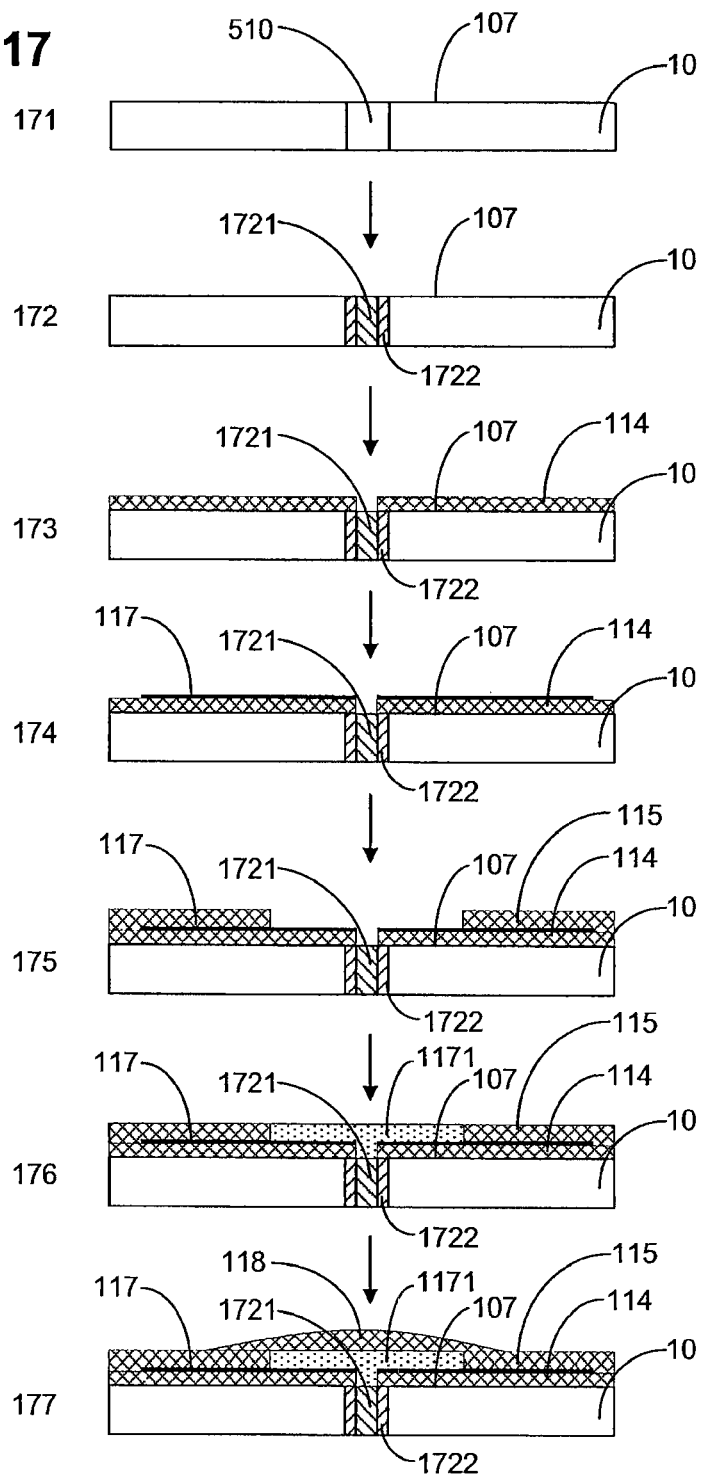
FIG. 17 illustrates, in cross-section, various steps of forming a thin film and connector on a substrate table.

FIG. 17 illustrates the method of an alternative or additional solution. In the method, an electrical connector 1721 is formed separately to the conductive layer 117 but, as with the embodiment of FIG. 14, electrical connection is made through the main body 10 of the substrate holder 100. Therefore, in this method, the barrier protrusion 500 does not present a difficulty. No space between burls 106 (not illustrated in FIG. 17) is taken up by the electrical connector 1721 because the connection is from the undersurface of the conductive layer 117.

No burls are illustrated in FIG. 17 to simplify the figure and to aid clarity. However, as with the other embodiments, particularly FIG. 14, the conductive layer 117 (and isolating layers 114, 115, 118) may be formed in patterns on the top surface 107 of the main body 10 around the burls 106.

In a first step 171 a main body 10 is provided. The main body 10 may be initially manufactured with a through hole 510 or a through hole 510 may be manufactured in the main body 10. The through hole 510 extends from the top surface 107 to a surface of the main body 10 opposite the top surface 107.

In step 172 an electrical connector 1721 is positioned in the through hole 510. The electrical connector 1721 extends from the top surface 107 of the main body 10 to the side of the main body 10 opposite the top surface 107 (the bottom surface as illustrated). An insulating layer 1722 may be provided around the electrical connector 1721 in order to insulate the electrical connector 1721 from the main body 10. In an embodiment the electrical connector 1721 is a plurality of electrical connectors, for example to connect different individual heaters, sensors, etc. formed in the conductive layer 117. In an embodiment the electrical connector 1721 is an electrically conductive pin surrounded by an electrically insulated bushing (the electrically insulated bushing replacing the isolating layer 1722). An embodiment of step 172 is illustrated in FIG. 18 and described below.

In step 173 an insulating layer 114 is applied to the top surface 107 of the main body 10. The insulating layer 114 may be provided over the electrical connector 1721 and then removed from over the electrical connector 1721. In an embodiment the insulating layer 114 may be provided such that it is not deposited on the electrical connector 1721. The insulating layer 114 may cover part of the electrical connector

1721, in plan, so long as it is still possible to make an electrical connection with the electrical connector 1721 from above.

In step 174 a conductive layer 117 is formed on the insulating layer 114. The conductive layer 117 may be applied by, for example, sputtering. As illustrated, the conductive layer 117 is not formed (or removed from) over the electrical connector 1721.

In step 175 a further insulating or isolating layer 115 is provided on top of the conductive layer 117. As with the insulating layer 114, the further layer 115 may be applied by coating or jetting, for example. The further layer 115 is provided such that it does not overlay all of the conductive layer 117, in plan. This allows in step 176 a further conductive layer 1171 to be deposited. The further conductive layer 1171 makes an electrical connection between the electrical connector 1721 and the conductive layer 117. In this way the conductive layer 117 is in electrical contact with the electrical connector 1721. Thereby a conductive path is provided from the bottom surface (as illustrated) of the main body 10 (the surface on a side opposite the top surface 107) to the conductive layer 117 which is on the top surface 107. In an embodiment step 176 comprises making a solder electrical contact between the conductive layer 117 and the electrical connector 1721. In an embodiment the further conductive layer 1171 is made by electroplating by, e.g., contacting the electrical connector 1721 from the side of the main body 10 opposite to the top surface 107.

In step 177 a capping isolating layer 118 is formed. The capping isolating layer 118 covers at least, in plan, the exposed surface of the further conductive layer 1171.

The method shown in FIG. 17 results in a substrate holder usable in a lithographic apparatus, the substrate holder comprising: a main body 10 having a surface 107; a conductive layer 117 on the surface 107; and an electrical connector 1722 extending through the main body 10 to provide a conductive path from a side of the main body opposite the surface 107 of the conductive layer.

As with the other embodiments, the conductive layer 117 may form part of the clamping system of the substrate holder 100 and/or may form sensors and/or heaters.

FIG. 18 illustrates an embodiment of step 172 of positioning an electrical connector 1721 in a through hole 510 of the main body 10. As illustrated in step 11711, the main body 10 is turned upside down so that the top surface 107 faces downwards. The through hole 510 is provided with a bevel on the side of the main body 10 opposite the top surface 107 to form a chamfer 511.

In step 11721 the electrical connector 1721, optionally along with insulating layer 1722, is positioned in the through hole 510 of the main body 10. The insulating layer 1722 is optional because the glue 1724 described below may be electrically insulating. One or more positioning members, such as one or more spacers, may be provided to position the electrical connector 1721 in the through hole 510. In an embodiment at least one spacer is provided underneath the main body 10 (for example on the top surface 107) to align the bottom end (as illustrated) of the electrical connector 1721 with the top surface 107.

In step 11722 glue 1724 is provided between the electrical connector 1721 (and optionally insulating layer 1722) and a side wall of the through hole 510, from above. In an embodiment the glue 1724 may be provided via a syringe or other similar container 1723. In an embodiment the glue 1724 is an electrically insulating material. In an embodiment the glue is benzocyclobutene (BCB) which is known to have low moisture absorption, a relatively low cure temperature, a high degree of planarization, good thermal stability, good compatibility with various metalization systems, low out-gassing etc. BCB is able to withstand temperatures of up to about 300° C. and is therefore suitable for use in a substrate table WT. The glue 1724 will not normally extend out beyond the top surface 107 in step 1722. If glue 1724 does extend onto the top surface 107, it can be removed prior to step 173. If the glue 1724 does not reach the top surface 107, the gap can be filled in step 173. Any excess glue will stay in the chamfer 511.

In step 11723 the glue 1724 (e.g. BCB) is cured.

In step 11724 the main body 10 is turned upside down so that the top surface 107 is facing upwards and the chamfer 511 in the side of the main body 10 is facing down.

Step 173 can then be performed as explained with reference to FIG. 17 above. For example a planarization or insulating layer 114 may be provided on the top surface 107 of the main body 10. The planarization or insulating layer 114 may be of the same material as the glue 1724, for example of BCB.

As with FIG. 18, the electrical connector 1721 may be a single interconnect or a multiple interconnect. It may or may not be surrounded by an electrically insulated bush (e.g. insulating layer 1722).

As will be appreciated, any of the above described features can be used with any other feature and it is not only those combinations explicitly described which are covered in this application.

In a first aspect there is provided a method of manufacturing a substrate holder for use in a lithographic apparatus, the method comprising: providing a main body having a surface and a plurality of burls projecting from the surface and having end surfaces to support a substrate; providing a carrier surface adjacent the main body surface; and forming a conductive layer on at least part of the main body surface and an integral part on at least part of the carrier surface.

In a second aspect, in the method of the first aspect, the part of the carrier surface on which the conductive layer is formed comprises a release surface, wherein one or more layers formed on the release surface can be lifted off the release surface or the release surface can be removed from the one or more layers formed thereon.

In a third aspect, in the method of the second aspect, the release surface comprises a coating.

In a fourth aspect, in the method of any of the first-third aspects, the conductive layer is integral with the main body.

In a fifth aspect, in the method of any of the first-fourth aspects, the carrier surface is on a further body positioned adjacent an edge of the main body.

In a sixth aspect, in the method of any of the first-fourth aspects, the carrier surface is on the main body.

In a seventh aspect, the method of any of the first-sixth aspects further comprises lifting the formed conductive layer off the carrier surface.

In an eighth aspect, in the method of any of the first-seventh aspects, the conductive layer is formed by a method selected from the following group: sputtering, spraying, screen printing, physical vapor deposition (PVD), chemical vapor deposition (CVD), or plasma-enhanced chemical vapor deposition (PECVD).

In a ninth aspect, in the method of any of the first-eighth aspects, the conductive layer is formed of a metal, such as a metal selected from the group consisting of: Cr, Al, Pt and alloys thereof.

In a tenth aspect, in the method of any of the first-ninth aspects, the conductive layer has a thickness in the range of from about 20 nm to about 1 μm.

In an eleventh aspect, the method of any of the first-tenth aspects further comprises, before forming the conductive layer, forming a lower isolation layer integral with the main body on at least the at least part of the main body surface and the at least part of the carrier surface to electrically isolate the conductive layer from the main body.

In a twelfth aspect, the method of any of the first-eleventh aspects further comprises forming on the conductive layer an upper isolation layer to electrically isolate the conductive layer from the surrounding environment.

In a thirteenth aspect, in the method of the eleventh or twelfth aspects, the isolation layer is formed of a material or a combination of materials selected from the group consisting of: benzocyclobutene, perhydropolysilazene, $SiO_x$, parylene and polyimide, desirably poly(4,4'-oxydiphenylene-pyromellitimide).

In a fourteenth aspect, in the method of any of the eleventh-thirteenth aspects, the isolation layer has a thickness in the range of from about 0.1 µm to about 100 µm.

In a fifteenth aspect, in the method of the fourteenth aspect, the isolation layer has a thickness in the range of from about 0.1 µm to about 10 µm, desirably from about 1 µm to about 3 µm.

In a sixteenth aspect, in the method of the fourteenth aspect, the isolation layer has a thickness in the range of from about 20 µm to about 100 µm, desirably from about 40 µm to about 60 µm.

In a seventeenth aspect, in the method of any of the eleventh-sixteenth aspects, the isolation layer is formed by a method selected from the following group: spin counting, sputtering, spraying, screen printing, physical vapor deposition (PVD), chemical vapor deposition (CVD), or plasma-enhanced chemical vapor deposition (PECVD).

In a eighteenth aspect, in the method of any of the first-seventeenth aspects, the integral part of the conductive layer extends a distance from the main body surface at least equal in magnitude to a thickness of the main body.

In a nineteenth aspect, in the method of any of the first-eighteenth aspects, the conductive layer on the main body forms at least part of a component selected from the group consisting of: an electrode, a heater, a sensor, a transistor and a logic device.

In a twentieth aspect, in the method of the nineteenth aspect, the electrode is, in use, an electrode of an electrostatic clamp.

In a twenty first aspect, in the method of the nineteenth or twentieth aspects, the conductive layer formed on the carrier surface provides an electrical connection for the transmission of power and/or electrical signals to and/or from the component from and/or to an end of the conductive layer formed on the carrier surface distal from the main body.

In a twenty second aspect, the method of any of the first-twenty first aspects further comprises forming a planarization layer on at least the at least part of the main body surface prior to forming the conductive layer.

In a twenty third aspect, in the method of the twenty second aspect, forming the planarization layer further comprises forming a first sub-layer and a second sub-layer on the first sub-layer, the second sub-layer having a different composition than the first sub-layer.

In a twenty fourth aspect there is provided a substrate holder for use in a lithographic apparatus, the substrate holder comprising: a main body having a surface; a plurality of burls projecting from the surface and having end surfaces to support a substrate; a conductive layer integral with the main body and on at least part of the main body surface with an integral part of the conductive layer extending off the main body surface.

In a twenty fifth aspect, in the substrate holder of the twenty fourth aspect, the integral part of the conductive layer is out of a plane of the main body surface.

In a twenty sixth aspect, in the substrate holder of the twenty fourth or twenty fifth aspect, the integral part of the conductive layer extends through the main body or a barrier protrusion surrounding the burls on the surface of the main body.

In a twenty seventh aspect, in the substrate holder of any of the twenty fourth-twenty sixth aspects, the conductive layer is formed of a metal, such as a metal selected from the group consisting of: Cr, Al, Pt and alloys thereof.

In a twenty eighth aspect, in the substrate holder of any of the twenty fourth-twenty seventh aspects, the conductive layer has a thickness in the range of from about 20 nm to about 1 µm.

In a twenty ninth aspect, the substrate holder of any of the twenty fourth-twenty eighth aspects further comprises an isolation layer on one or both sides of the conductive layer to electrically isolate the conductive layer.

In a thirtieth aspect, in the substrate holder of any of the twenty fourth-twenty ninth aspects, the isolation layer is formed of a material selected from the group consisting of: benzocyclobutene; perhydropolysilazene, $SiO_x$, parylene and polyimide, desirably poly(4,4'-oxydiphenylene-pyromellitimide).

In a thirty first aspect, in the substrate holder of the thirtieth aspect, the isolation layer has a thickness in the range of from about 0.1 µm to about 100 µm.

In a thirty second aspect, in the substrate holder of the thirty first aspect, the isolation layer has a thickness in the range of from about 0.1 µm to about 5 µm, desirably from about 1 µm to about 2 µm.

In a thirty third aspect, in the substrate holder of the thirty first aspect, the isolation layer has a thickness in the range of from about 20 µm to about 100 µm, desirably from about 40 µm to about 60 µm.

In a thirty fourth aspect, in the substrate holder of any of the twenty fourth-thirty third aspects, the conductive layer on the main body forms at least part of a component selected from the group consisting of: an electrode, a heater, a sensor, a transistor and a logic device.

In a thirty fifth aspect, in the substrate holder of the thirty fourth aspect, the electrode is, in use, an electrode of an electrostatic clamp.

In a thirty sixth aspect, the substrate holder of any of the twenty fourth-thirty fifth aspects further comprises a planarization layer between the conductive layer and the main body surface.

In a thirty seventh aspect, in the substrate holder of any of the twenty fourth-thirty sixth aspects, the at least part of the integral part of the conductive layer extending off the main body surface is flexible.

In a thirty eighth aspect there is provided a lithographic apparatus, comprising: a support structure configured to support a patterning device; a projection system arranged to project a beam patterned by the patterning device onto a substrate; and a substrate holder arranged to hold the substrate, the substrate holder comprising: a main body having a surface, a plurality of burls projecting from the surface and having end surfaces to support a substrate, and a conductive layer integral with the main body and on at least part of the main body surface with an integral part of the conductive layer extending off the main body surface.

In a thirty ninth aspect there is provided a device manufacturing method using a lithographic apparatus, the method comprising: projecting a beam patterned by a patterning device onto a substrate while holding the substrate on a substrate holder, wherein the substrate holder comprises: a main body having a surface, a plurality of burls projecting from the surface and having end surfaces to support a substrate, and a conductive layer integral with the main body and on at least part of the main body surface with an integral part of the conductive layer extending off the main body surface.

In a fortieth aspect there is provided a method of manufacturing a substrate holder for use in a lithographic apparatus, the method comprising: positioning an electrical connector in a through hole extending through a main body from a surface of the main body to a side of the main body opposite the surface; and forming a layer on the surface including a conductive layer in electrical contact with the electrical connector.

In a forty first aspect, in the method of the fortieth aspect, the electrical connector is glued in the through hole by applying glue from the side of the main body opposite the surface.

In a forty second aspect, in the method of the forty first aspect, the glue is applied from above and the main body is turned over between applying glue and forming a layer.

In a forty third aspect, in the method of the forty first or forty second aspects, the glue and a layer on the surface are of the same material.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) and extreme ultraviolet (EUV) radiation (e.g. having a wavelength of or about 365, 248, 193, 157, 126, 13.5 or 6.5 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A method of manufacturing a substrate holder for use in a lithographic apparatus, the method comprising:
   providing a main body having a surface and a plurality of burls projecting from the surface and having end surfaces to support a substrate;
   providing a carrier surface extending laterally adjacent the surface of the main body; and
   forming a conductive layer on at least part of the surface of the main body and an integral part of the conductive layer on at least part of the carrier surface, wherein (i) the carrier surface is movable with respect to the surface of the main body, (ii) the integral part is releasable from the carrier surface, or (iii) both (i) and (ii).

2. The method of claim 1, wherein the part of the carrier surface on which the conductive layer is formed comprises a release surface, wherein a layer formed on the release surface can be lifted off the release surface or the release surface can be removed from the layer formed thereon.

3. The method of claim 2, wherein the release surface comprises a coating.

4. The method of claim 1, wherein the conductive layer is integral with the main body.

5. The method of claim 1, wherein the carrier surface is on a further body positioned adjacent an edge of the main body.

6. The method of claim 1, wherein the carrier surface is on the main body.

7. The method of claim 1, further comprising lifting the formed conductive layer off the carrier surface.

8. The method of claim 1, further comprising, before forming the conductive layer, forming a lower isolation layer integral with the main body on at least the at least part of the surface of the main body and the at least part of the carrier surface to electrically isolate the conductive layer from the main body.

9. The method of claim 1, further comprising forming on the conductive layer an upper isolation layer to electrically isolate the conductive layer from the surrounding environment.

10. The method of claim 1, wherein the integral part of the conductive layer extends a distance from the surface of the main body at least equal in magnitude to a thickness of the main body.

11. The method of claim 1, wherein the conductive layer on the main body forms at least part of a component selected from the group consisting of: an electrode, a heater, a sensor, a transistor and a logic device.

12. The method of claim 1, further comprising forming a planarization layer on at least the at least part of the surface of the main body prior to forming the conductive layer.

13. A substrate holder for use in a lithographic apparatus, the substrate holder comprising:
a main body having a surface;
a plurality of burls projecting from the surface and having end surfaces to support a substrate;
a conductive layer integral with the main body and on at least part of the surface of the main body; and
an isolation layer on one or both sides of the conductive layer to electrically isolate the conductive layer,
wherein a flexible integral part of the conductive layer and a flexible at least part of the isolation layer both extend off the main body at least partly unsupported.

14. The substrate holder of claim 13, wherein the integral part of the conductive layer is out of a plane of the surface of the main body.

15. The substrate holder of claim 13, wherein the integral part of the conductive layer extends through the main body or a barrier protrusion surrounding the burls on the surface of the main body.

16. The substrate holder of claim 13, wherein at least part of the isolation layer is on the at least part of the surface of the main body and the at least part of the isolation layer extending off the main body is integral with the at least part of the isolation layer on the at least part of the surface of the main body.

17. The substrate holder of claim 13, further comprising a planarization layer between the conductive layer and the surface of the main body.

18. A lithographic apparatus, comprising:
a projection system arranged to project a patterned beam of radiation onto a substrate; and
a substrate holder arranged to hold the substrate, the substrate holder comprising:
a main body having a surface,
a plurality of burls projecting from the surface and having end surfaces to support a substrate,
a conductive layer integral with the main body and on at least part of the surface of the main body, and
an isolation layer on one or both sides of the conductive layer to electrically isolate the conductive layer,
wherein a flexible integral part of the conductive layer and a flexible at least part of the isolation layer both extend off the main body at least partly unsupported.

19. A device manufacturing method using a lithographic apparatus, the method comprising:
projecting a beam patterned by a patterning device onto a substrate while holding the substrate on a substrate holder, wherein the substrate holder comprises: a main body having a surface, a plurality of burls projecting from the surface and having end surfaces to support a substrate, a conductive layer integral with the main body and on at least part of the surface of the main body, and an isolation layer on one or both sides of the conductive layer to electrically isolate the conductive layer; and
providing electricity to the conductive layer on at the least part of the surface of the main body via a flexible integral part of the conductive layer and a flexible at least part of the isolation layer that both extend off the main body at least partly unsupported.

20. A method of manufacturing a substrate holder for use in a lithographic apparatus, the method comprising:
positioning an electrical connector in a through hole extending through a main body from a surface of the main body to a side of the main body opposite the surface;
forming a layer on the surface including a first conductive layer, wherein the first conductive layer does not contact an electrically conductive part of the electrical connector; and
after forming the first conductive layer, forming a second conductive layer to make electrical contact between the first conductive layer and the electrically conductive part of the electrical connector.

* * * * *